United States Patent
Garyainov et al.

(10) Patent No.: US 7,098,072 B2
(45) Date of Patent: Aug. 29, 2006

(54) FLUXLESS ASSEMBLY OF CHIP SIZE SEMICONDUCTOR PACKAGES

(75) Inventors: Stanislav A. Garyainov, Moscow (RU); Alexander S. Gotman, Santa Monica, CA (US); Vladimir V. Novikov, Saint Petersburg (RU)

(73) Assignee: AGNG, LLC, Santa Monica, CA (US)

( * ) Notice: Subject to any disclaimer, the term of this patent is extended or adjusted under 35 U.S.C. 154(b) by 0 days.

(21) Appl. No.: 10/501,431

(22) PCT Filed: Mar. 1, 2002

(86) PCT No.: PCT/US02/06183

§ 371 (c)(1),
(2), (4) Date: Jul. 13, 2004

(87) PCT Pub. No.: WO03/075337

PCT Pub. Date: Sep. 12, 2003

(65) Prior Publication Data

US 2005/0042838 A1    Feb. 24, 2005

(51) Int. Cl.
*H01L 21/30*    (2006.01)
*H01L 21/44*    (2006.01)
*H01L 21/46*    (2006.01)
*H01L 21/48*    (2006.01)
*H01L 21/50*    (2006.01)

(52) U.S. Cl. .................... 438/107; 438/455
(58) Field of Classification Search ............. 438/107, 438/122, 108, 106, 455, 456
See application file for complete search history.

(56) References Cited

U.S. PATENT DOCUMENTS

| | | | |
|---|---|---|---|
| 4,810,671 A | 3/1989 | Bhattacharyya et al. | |
| 4,921,157 A | 5/1990 | Dishon et al. | |
| 5,111,991 A | 5/1992 | Clawson et al. | |
| 5,237,130 A | 8/1993 | Kulesza et al. | |
| 5,346,857 A | 9/1994 | Scharr et al. | |
| 5,448,014 A | 9/1995 | Kong et al. | |
| 5,760,473 A | 6/1998 | Dickson et al. | |
| 5,794,330 A | 8/1998 | Distefano et al. | |
| 5,816,478 A | 10/1998 | Kaskoun et al. | |
| 5,852,257 A | 12/1998 | Dittman et al. | |
| 5,865,365 A | 2/1999 | Nishikawa et al. | |
| 5,899,737 A | 5/1999 | Trabucco | |
| 5,900,674 A * | 5/1999 | Wojnarowski et al. | 438/107 |
| 5,938,454 A * | 8/1999 | Brodsky et al. | 439/71 |
| 6,119,920 A | 9/2000 | Guthrie et al. | |

* cited by examiner

Primary Examiner—Walter L. Lindsay, Jr.
(74) Attorney, Agent, or Firm—Don C. Lawrence

(57) ABSTRACT

A method for assembling semiconductor packages (10) includes forming corresponding pairs of conductive pads (14, 16, 20, 22) on respective surfaces of a die (12) and an interconnective substrate (18). Each pad in each pair includes an upper portion comprising at least one component of an electrically conductive eutectic alloy. Sharp, upstanding peaks (50, 58) are formed on at least one of the pads in each pair. The die and substrate are forcefully abutted and the pads heated until the sharp peaks penetrate through oxide films (52) on the respective opposing pads in each pair and contact the upper surface of the other pad therein, thereby initiating pad fusion. The pads are then cooled to solidify the molten portions thereof into an electrically conductive joint between each corresponding pair of pads and a hermetic seal around the periphery of the package.

15 Claims, 4 Drawing Sheets

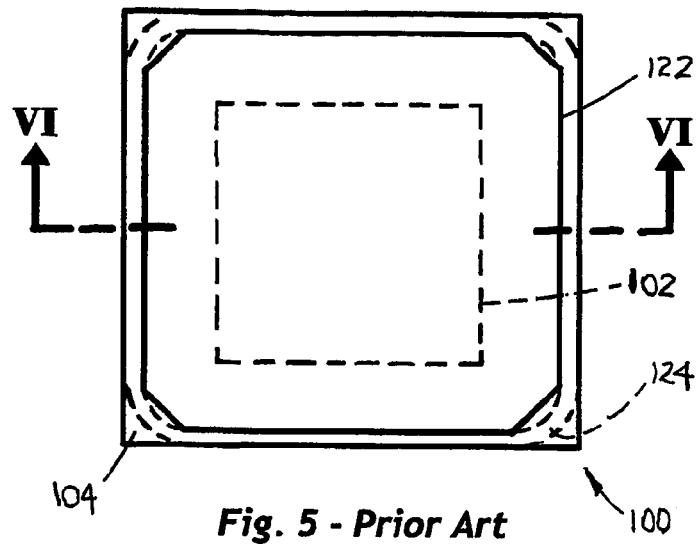
Fig. 5 - Prior Art
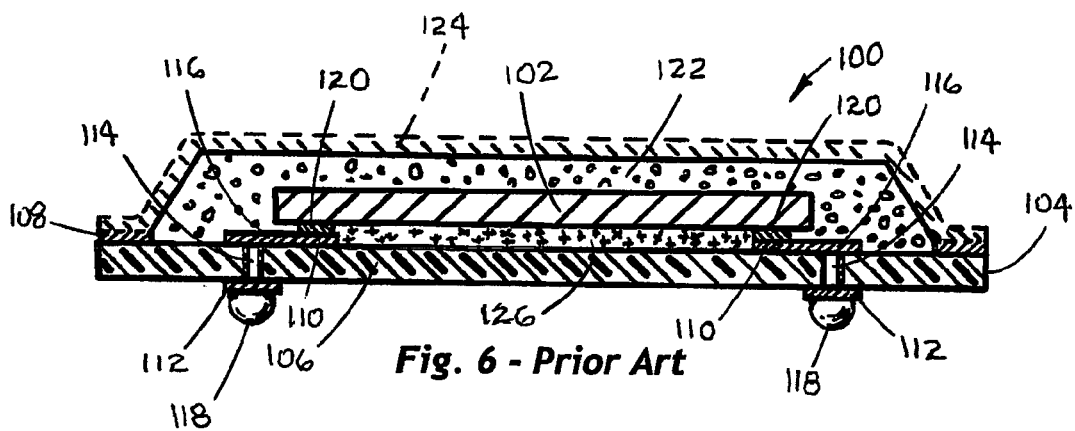
Fig. 6 - Prior Art
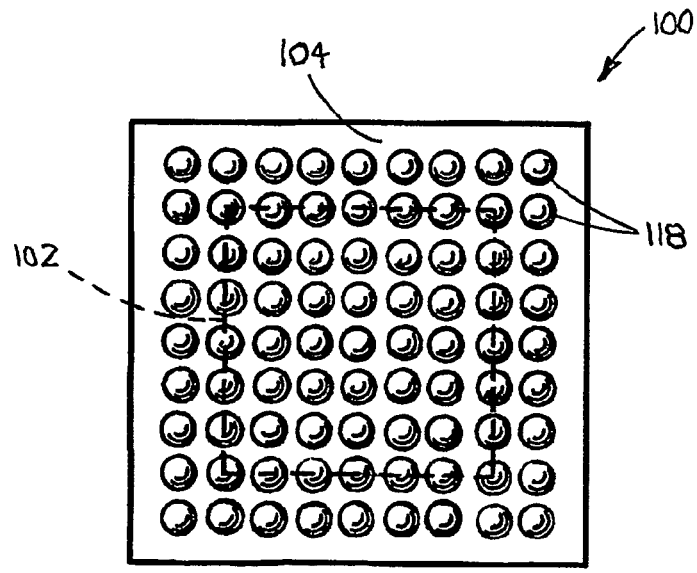
Fig. 7 - Prior Art

FLUXLESS ASSEMBLY OF CHIP SIZE SEMICONDUCTOR PACKAGES

TECHNICAL FIELD

This invention relates, in general, to the soldering of one substrate to another with electrically conductive eutectic alloys, and in particular, to the electrical assembly and hermetic sealing of chip size semiconductor packages without the use of fluxes or reducing atmospheres.

BACKGROUND ART

Integrated circuits ("ICs") are formed in the "active" surface of a single die, or "chip," cut from a semiconductor wafer containing an integral array of identical dies. The dies are relatively small and fragile, are susceptible to harmful environmental elements, particularly moisture, and during operation, can generate a relatively large amount of heat in a relatively small volume. Accordingly, ICs are typically assembled in affordable, yet robust, packages that protect them from the environment, enable them to be reliably mounted to and interconnected with, for example, a printed circuit board ("PCB") populated with associated electronic components, and to effectively dissipate to the ambient the heat they generate during operation.

A recent trend in the electronics industry has been toward equipments that are smaller, lighter, and yet more functional. This has resulted in a concomitant demand for semiconductor packages that have smaller outlines and mounting "footprints," yet increased functionality. One response to this trend has been the development of "chip-scale," or "chip-size," semiconductor packages, including ball grid array ("BGA"), land grid array ("LGA"), and lead-less chip carrier ("LCC") packages, which are surface mounting devices that have outline and mounting dimensions only slightly greater than those of the semiconductor die packaged therein.

An example of one known type of such a chip size package, viz., a so-called "ball grid array" ("BGA") semiconductor package 100, is illustrated in the top plan, cross-sectional elevation, and bottom plan views of FIGS. 5–7, respectively. As shown in the figures, the conventional BGA package 100 comprises a semiconductor die 102 soldered to and in electrical connection with an interconnective substrate 104, the latter serving both to redistribute the electrical input/output ("I/O") signals to and from the die, and to assist in the hermetic sealing of the die against harmful environmental agents, including moisture.

A laminate type of substrate 104, such as the simple, three-layer embodiment illustrated in the figures, typically comprises one or more dielectric layers 106 on which one or more patterned metal layers 108 are formed. The metal layers 108 are patterned, typically by photo-etching techniques, to include signal connection pads 110 on the upper surface of the dielectric layer 106 and terminal lands 112 on the lower surface thereof. The connection pads 110 are connected to the lands 112 through the thickness of the substrate 102 by plated-through holes 114, called "vias." The metal layers 108 may also be patterned to include circuit traces 116 on one or both surfaces of the dielectric layer 106 that connect one or both of the connection pads 110 and the lands 112 to each other through the vias 114.

In a conventional BGA package 100, balls 118 of a conductive metal, e.g., a lead-tin solder, are formed on respective ones of the lands 112, which are arranged in the form of a "grid," or rectangular array, to serve as signal input/output and mounting terminals of the package 100. In LGA and LCC packages, the terminal balls 118 are omitted, and the lands 112 themselves serve as the package terminals.

To effect the signal redistribution function, signal I/O pads 120 on the active surface of the die 102 may be bonded to the signal connection pads 110 on the substrate 104 with fine, conductive wires (not illustrated), or alternatively, as illustrated in FIG. 6, soldered directly to the connection pads 110 using the so-called "flip-chip," or "C4," method of die attachment, typically with a flux and a solder comprising lead (Pb) and tin (Sn).

The "flip-chip" method of attaching chips to and in electrical connection with substrates was developed by, inter alia, IBM, Inc., in about 1965. Sometimes referred to as the "Controlled Collapse Chip Connection," or "C4," method (see, e.g., L. F. Miller, "Controlled Collapse Reflow Chip Joining," IBM J. Res. Develop., 239–250, May 1969), the technique involves forming bumps of a conductive metal, e.g., solder, on the signal I/O pads 120 on the active surface of the chip 102, then inverting, or "flipping" the chip upside-down and "reflowing," or fusing, the solder bumps to the corresponding connection pads 110 on the substrate 104, which is conventionally effected in a conveyor oven using a flux.

The package 100 is typically hermetically sealed by molding a dense body 122 of plastic, e.g., a filled epoxy resin, over the mounted die 102 and at least a portion of the substrate 104, or alternatively, by attaching, e.g., by soldering, a metal lid 124 (shown by dashed outline in FIGS. 5 and 6) to the substrate that covers the die. Prior to sealing, it is conventional to clean the narrow space between the die 102 and the substrate 104 thoroughly of any residual flux, then "underfill" the space with a layer 126 of a low-viscosity liquid plastic, which is then cured solid. The underfill layer 126 serves to support the die 102 above the substrate 104 and prevent the plastic of an encapsulating body 122 from penetrating into the space and forming a potentially destructive "thermal wedge" between the die and the substrate at elevated temperatures, or alternatively, to prevent any flux residue remaining in the package from the solder attachment of a lid from corroding the connection pads and the active surface of the die during the life of the package.

While the conventional BGA package 100 assembly techniques illustrated and described above afford a generally satisfactory solution to the need for a chip size semiconductor package, they are not without certain drawbacks. One of these relates to the need for using a flux in the soldering, or electrical attachment, of the die to the substrate, and the concomitant need to clean the assembly thoroughly of any flux residue before the package is sealed to prevent subsequent corrosion by the flux residue. The need for a flux in the die attachment process arises from the presence of oxide films that form on the solder and the connection pads as a result of the reaction of the metals in the solder and pads with oxygen in the atmosphere. The oxide films prevent the wetting by the solder of the surfaces to be joined. Fluxes strip and chemically bind with the oxide films at elevated temperatures and thereby "clean" the metal of the pads of any oxides and enable the solder to wet and join with the metal.

While it is possible to eliminate the use of a flux by first carefully cleaning the metal of the contacts of any oxide films and then effecting the soldering of the die to the substrate in a "reducing" atmosphere, e.g., one containing hydrogen, this procedure is relatively costly and involves the use of equipment that is complex, expensive, and potentially dangerous. It is therefore desirable to provide a method for soldering a first substrate, e.g., a semiconductor die to and in electrical connection with a second substrate, e.g., an interconnective substrate of a semiconductor package, without using fluxes or reducing atmospheres, or the complex cleaning processes that they entail.

Another drawback of the conventional package is the need for separate, costly processes and structures for hermetically sealing the active surface of the die and the electrical contacts between the die and the substrate from the ambient. It is therefore desirable to provide a method for hermetically sealing a semiconductor package without the need for these additional processes and materials, and further, to effect such a seal simultaneously with the electrical connection of the die to the substrate.

Yet another drawback of the prior art package is the widespread use of solder alloys containing lead, primarily because of the relatively low melting temperature of lead and the relatively high strength of the joints formed thereof when solidified. Lead is toxic and can have a significant, long-term adverse impact on the environment when electronic devices with solder joints containing lead are disposed of, e.g., in landfills. It is therefore desirable to provide a method of soldering a semiconductor die to a substrate using electrically conductive alloys that have relatively low melting temperatures, relatively high joint strength when solidified, but which contain no lead or other element that is harmful to the environment when disposed of.

DISCLOSURE OF INVENTION

In accordance with one aspect of the present invention, a method is provided for soldering a first substrate, e.g., a semiconductor die, to and in electrical connection with, a second substrate, e.g., an interconnective substrate of a semiconductor package, with low-melting-temperature, electrically conductive eutectic alloys, including lead-free alloys, without using fluxes or reducing atmospheres. In accordance with another aspect of the invention, a method is provided for hermetically sealing a semiconductor package simultaneously with the electrical connection of the die to the substrate without additional sealing processes and materials.

The method of the invention is characterized by forming one or more first electrically conductive pads on a first surface of the first substrate. The first pads may comprise, e.g., the signal input/output pads on the active surface of a semiconductor die. Each of the first pads includes at least an upper portion comprising at least one component of an electrically conductive eutectic alloy. One or more electrically conductive second pads are formed on a first surface of the second substrate. The second pads may comprise, e.g., the signal connection pads on an inter-connective substrate of a semiconductor package. Each of the second pads includes at least an upper portion comprising at least one other component of the eutectic alloy and corresponds in number and placement to a respective one of the first pads on the first substrate, thereby defining one or more corresponding pairs of pads on the two substrates. One or more sharp, upstanding peaks are formed on an upper surface of at least one of the first and second pads in each corresponding pair thereof.

The particular eutectic alloy selected for the soldering process may comprise, e.g., the well known binary eutectic alloy of tin (Sn) and lead (Pb) [63% Sn+37% Pb; soldering temperature ("ST")=188° C.], or alternatively, a lead-free, multi-component eutectic alloy, e.g., tin (Sn), zinc (Zn) and aluminum (Al) [88% Sn+10.4% Zn+1.5% Al; ST=210° C.].

The respective first surfaces of the first and second substrates are urged toward each other such that the respective upper surfaces of the first and second pads in each corresponding pair thereof are brought together in a forceful opposing abutment with each other. The opposing pads are then heated to at least the soldering temperature of the eutectic alloy, and until the one or more sharp peaks on the at least one pad in each corresponding pair thereof penetrate through any oxide films on the respective upper surfaces of the opposing pair of pads and contact the upper surface of the opposing other pad in the pair. This initiates melting and dissolution of the respective upper portions of the opposing pads into each other without the need for a flux or reducing atmosphere. After joining, the opposing pads are cooled to solidify the inter-dissolved, molten eutectic upper portions thereof into an electrically conductive joint between each corresponding pair of pads.

Semiconductor packages assembled by the method of the invention may be hermetically sealed by conventional techniques, e.g., by encapsulation with plastic or with a sealing lid, but in one particularly advantageous embodiment of the invention, the first and second pads can further comprise a pair of corresponding frames formed around the respective peripheries of the respective first surfaces of the die and the interconnective substrate. The two frames thereby have the same structure and alloy constituency as respective ones of the first and second signal pads, and are soldered to each other simultaneously with the soldering together of the corresponding pairs of signal pads of the die and the substrate, thereby closing and hermetically sealing the narrow space inside of the joined frames and between respective first surfaces of the die and the substrate, including the active surface of the die and the electrical contacts between the die and the substrate, from the ambient.

A better understanding of the above and other features and advantages of the invention may be obtained from the detailed description of the Modes for Carrying Out the Invention below, particularly if that description is considered in conjunction with the figures of the associated drawings.

BRIEF DESCRIPTION OF THE DRAWINGS

FIG. 5 is a top plan view of a chip size BGA semiconductor package assembled in accordance with the method of the prior art;

FIG. 6 is an enlarged cross-sectional elevation view of the package shown in FIG. 5, as revealed by the section taken along the lines VI—VI therein; and, FIG. 7 is a bottom plan view of the prior art package shown in FIGS. 5 and 6.

MODES FOR CARRYING OUT THE INVENTION

Figure 1:
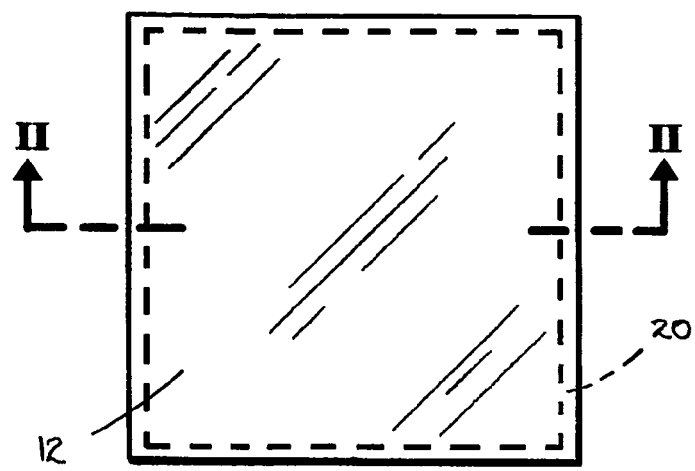
FIG. 1 is a top plan view of a chip size semiconductor package assembled in accordance with one method of the present invention.
Figure 2:
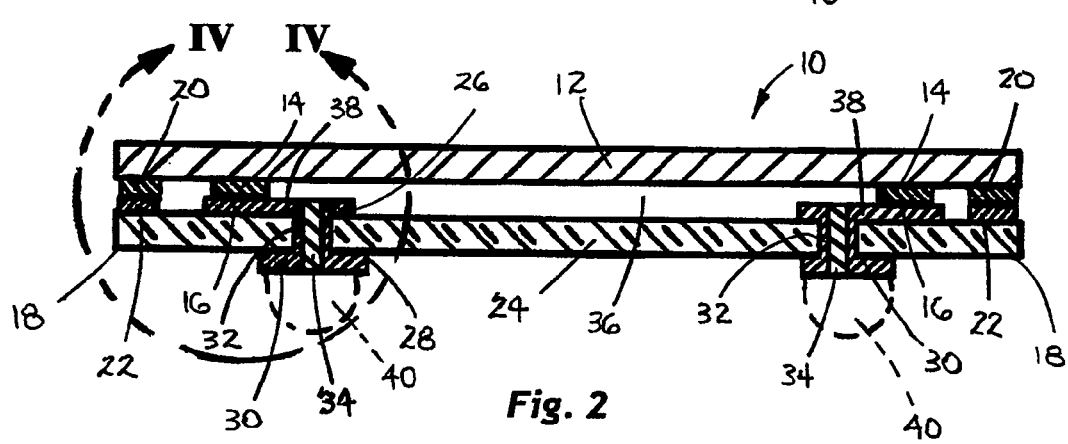
FIG. 2 is an enlarged cross-sectional elevation view of the package shown in FIG. 1, as revealed by the section taken along the lines II—II therein.
Figure 3:
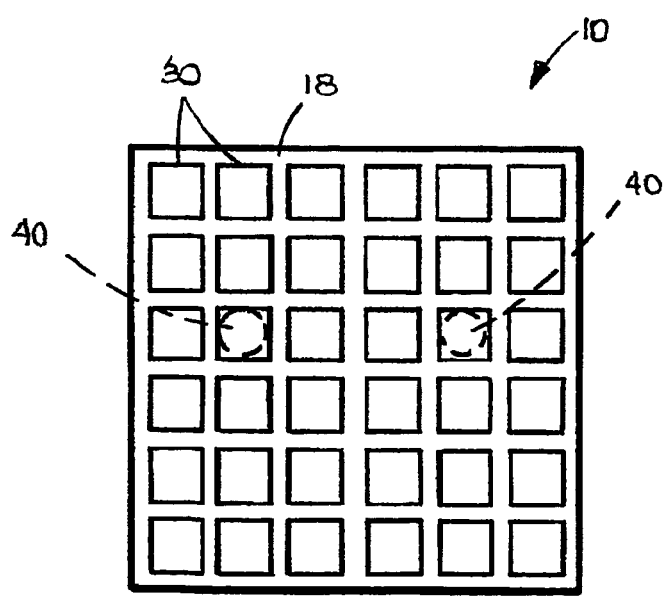
FIG. 3 is a bottom plan view of the package shown in FIGS. 1 and 2.

A chip size semiconductor package 10 assembled in accordance with the method of the present invention is illustrated in the top plan, cross-sectional elevation, and bottom plan views of FIGS. 1–3, respectively. The novel package 10 comprises a first substrate 12, e.g., a semiconductor die, having a first, active surface with one or more electrically conductive first pads 14, e.g., signal I/O pads, formed thereon, soldered to and in electrical connection with one or more corresponding electrically conductive second pads 16, e.g., signal connection pads, formed on a first surface of a second substrate 18, e.g., an interconnective substrate of the package 10, in accordance with the method of the invention. Optionally, the respective first and second pads 14 and 16 of the die 12 and interconnective substrate 18 may further comprise a pair of corresponding first and second sealing frames 20 and 22, each extending around a periphery of a respective one of the first surfaces of the die and the substrate, which are used to hermetically seal the package 10 in the manner described below.

With the exception of the signal I/O pads 14 and optional sealing frame 20 formed thereon, and the method by which those respective elements are soldered to the corresponding pads 16 and frame 22 on the second substrate 18, the first substrate 12 may otherwise comprise a conventional semiconductor die that is cut, or "singulated," from a wafer of semiconductor material, e.g., silicon or germanium (Ge), containing an integral array of identical dies 14, each of which includes an IC formed in the first, or active, surface thereof by conventional semiconductor fabrication techniques, including conventional photolithography, etching, doping, chemical vapor deposition, plating and vapor deposition processes. Indeed, as discussed below, several of these same conventional techniques can also be used for forming the corresponding pairs of signal pads 14 and 16, and the optional corresponding sealing frames 20 and 22, on respective ones of the first and second substrates 12 and 18.

As illustrated in FIG. 2, the second, or interconnective, substrate 18 comprises a laminate of a dielectric layer 24 having opposite first and second surfaces, each with a respective one of first and second patterned metal layers 26 and 28 disposed thereon. The metal layer 26 on the first, or upper, surface of the substrate 18 may be patterned to include at least a lower portion of the second, signal connection pads 16 described above, and the metal layer 28 on the second, or lower, surface of the substrate 18 may be patterned to include an array of terminal lands 30. Plated-through metal vias 32 electrically connect the first metal layer 26 to the second metal layer 28 through the thickness of the dielectric layer 24.

The through-openings in the substrate 18 created by the vias 32 can be filled, e.g., with a "plug" 34 of solder or an electrically conductive epoxy resin, to ensure that there are no discontinuities in the substrate through which moisture can enter into the narrow space 36 between the two substrates and contaminate the first, or active surface of the die or the electrical connections between the die and the second substrate 18. The metal layers 26 and 28 may additionally be patterned to include circuit traces 38 on one or both surfaces of the dielectric layer 24, for electrically connecting the connection pads 16 through the vias 32 and to the lands 30. Metal bumps 40, e.g., of solder, may be formed on respective ones of the lands 30 to serve, in the case of a BGA type of package 10, as I/O terminals of the package, or in the case of a LGA or LCC type of package, the lands 30 may be left bare to function themselves as package I/O terminals.

The interconnective substrate 18 of the invention may comprise one of a variety of possible embodiments. For example, the dielectric layer 24 can comprise a ceramic, e.g., silicon dioxide ($SiO_2$), gallium arsenide ("GAS"), quartz, alumina, aluminum nitride ("AlN"), or a laminate of one or more layers of the foregoing materials, and the metal layers 26 and 28 can comprise, e.g., a tungsten-bearing ink that is printed on the ceramic layer in the pattern desired, and then "co-fired" with the ceramic layer to form a hard, rigid structure. Alternatively, the dielectric layer 24 can comprise one or more layers of a resin, such as polyimide, on which the metal layers 26 and 28, e.g., copper or aluminum foil, are laminated or plated, then patterned using conventional photolithography and etching techniques. In yet another possible embodiment, the dielectric layer 24 may comprise a matrix of fiberglass or polycarbonate fibers impregnated with a resin, e.g., an epichloridehydrin bisphenol-A (epoxy) resin, a bismaleimidetriazine ("BT") resin, or a polytetrafluoroethylene ("PTFE") resin.

In addition, it should be understood that the method of soldering the die 12 in electrical connection with the substrate 18 of the present invention is not limited to the above, "laminate," types of interconnective substrates 18, but can also be carried out in conjunction with conventional metal lead frame types of substrates (not illustrated), for assembling so-called "Lead-On-Chip" ("LOC") types of semiconductor packages.

As may be seen from the foregoing, the second, interconnective substrate 18 of the invention is, with the exception of the connection pads 16 and optional sealing frame 22 formed thereon, and the method whereby they are soldered to the corresponding pads 14 and frame 20 on the first substrate or die 12, otherwise relatively conventional in its construction.

In accordance with the present invention, several modes are provided for assembling the die 12 to and in electrical connection with the interconnective substrate 18, and optionally, for simultaneously hermetically sealing the package 10, without using fluxes or reducing atmospheres. These modes are now described in conjunction with FIGS. 4A–4D, which are enlarged cross-sectional detail views of the encircled portion IV—IV of the package 10 shown in FIG. 2, each illustrating a different mode for carrying out the invention.

Figure 4A:
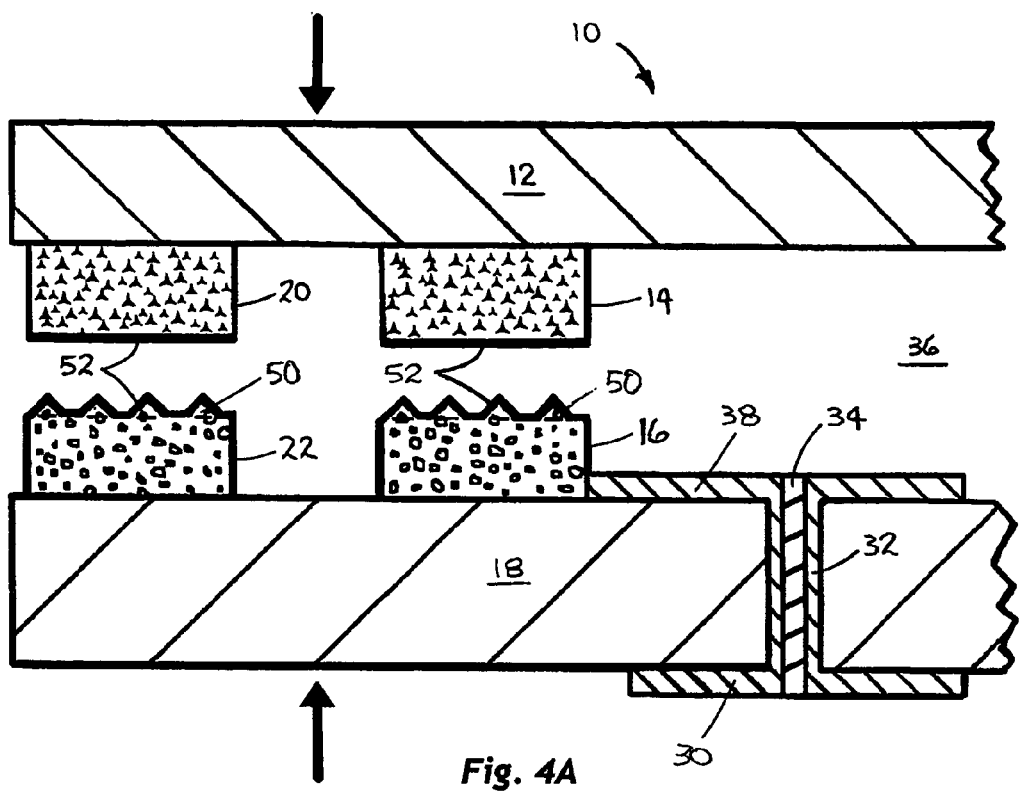
FIG. 4A is an enlarged cross-sectional detail view of the encircled portion IV—IV of the package shown in FIG. 2, showing one mode for carrying out the invention.

With reference to the particular embodiment illustrated in FIG. 4A, the method is characterized by forming the one or more first pads 14, which may include forming the optional sealing frame 20, on the first surface of the first substrate 12, i.e., the active surface of a semiconductor die, and forming the one or more corresponding second pads 16, which may include forming the optional corresponding sealing frame 22, on the first surface of the second, interconnective substrate 18.

The first or signal I/O pads 14 are formed to intersect, and thereby electrically connect with, an electrically conductive trace (not illustrated), e.g., a metallization formed on or within the die 12, which in turn, is electrically connected to the IC (not illustrated) contained therein, and to include at least an upper portion comprising at least one component of an electrically conductive eutectic alloy. The second pads 16 are formed to intersect, and thereby electrically connect with, a circuit trace 38 patterned on the second substrate 18, and to include at least an upper portion comprising at least one other component of the eutectic alloy.

In the particular embodiment illustrated in FIG. 4A, each of the respective first and second pads 14 and 16 and sealing frames 20 and 22 consists entirely of a respective one of the at least one eutectic alloy components associated with the respective substrate. However, as discussed below in connection with the embodiments shown in FIGS. 4B–4D, it is also possible to carry out the invention with pads 14 and 16 and frames 20 and 22 having respective lower portions 42, 44, 46 and 48 that are of a material that is electrically conductive, e.g., a metal or a semiconductor, but which does not necessarily include any of the eutectic alloy components.

The particular eutectic alloy used in forming the respective pads 14 and 16 and frames 20 and 22 may be selected in accordance with the particular properties desired thereof, e.g., its soldering temperature. It should be understood, however, that if more than one component of the alloy is present on either pad or frame in a corresponding pair thereof, then the portion of that pad or land comprising the eutectic components must comprise the full complement of the alloy, and not just a single component thereof, and further, that the components of the alloy must be present in the specific percentages, by weight, necessary to constitute the eutectic alloy.

Thus, in the case of a two-component, or "binary," eutectic alloy, e.g., gold (Au) and silicon [94% Au+6% Si; ST=380° C.], the first pads 14 and frame 20 may consist entirely of silicon, and the second pads 16 and frame 22 may consist entirely of gold, with the amounts of the respective two components of the alloy in the respective sets of pads and frames being relatively unimportant. Alternatively, at least one or both sets of pads and frames in each corresponding pair thereof may comprise both of the components of the eutectic alloy, i.e., 94% Au+6% Si. Moreover, in the case of eutectic alloys consisting of three or more constituent elements, e.g., tin, zinc and aluminum [88% Sn+10.4% Zn+1.5% Al; ST=210° C.], at least one of the pads and frames in each corresponding pair thereof must include all three of the components of the eutectic alloy, and in the weight percentages of the individual components thereof indicated above, and optionally, both pads and frames in each corresponding pair thereof may comprise the complete alloy.

In the following table, a partial listing is given of the many electrically conductive eutectic alloys, together with the weight percentages of their respective constituent components and approximate soldering temperature ("ST"), with which the invention may be carried out, wherein, inter alia, "Cd" is cadmium, "Cu" is copper, "Ag" is silver, and "Bi" is bismuth.

| Eutectic Alloy Composition | ST, ° C. |
|---|---|
| 63% Sn + 37% Pb | 188 |
| 94% Au + 6% Si | 380 |
| 99.5% Sn + 0.5% Bi | 232 |
| 97% Sn + 3% Ag | 225 |
| 67.8 Sn + 32.2 Cd | 187 |
| 17.4% Zn +82.6 Cd | 275 |
| 43% Sn + 57% Bi | 150 |
| 46% Al + 54% Ge | 440 |
| 88.1% Sn + 10.4% Zn + 1.5% Al | 210 |
| 70–80% Zn + 18–28% Al + 2% Si | 380–420 |

-continued

| Eutectic Alloy Composition | ST, ° C. |
|---|---|
| 93% Zn + 5% Al + 2% Ge | 390 |
| 56% Zn + 4% Al + 40% Cd | 340 |
| 57% Zn + 39% Al + 4% Cd | 320 |
| 30% Zn + 66% Cd + 4% Sn | 294 |
| 48–35% Zn + 25–63% Sn + 0.5–11% Cu + 0.5–1.5 Al | 250 |

In addition to the formation of the corresponding pairs of pads 14 and 16 and optional sealing frames 20 and 22 on the respective substrates 12 and 18, the method of the present invention further includes forming at least one sharp, upstanding peak 50 on an upper surface of at least one of the pads and frames in each corresponding pair thereof. In the particular embodiment shown in FIG. 4A, the sharp peaks 50 are shown formed on respective ones of the second pads 16 and the frame 22, i.e., those of the second, interconnective substrate 18. However, the peaks 50 may instead be formed on respective ones of the other, first pads 14 and frame 20, or alternatively, on respective ones of both sets of the first and second pads and frames.

The sharp peaks 50 serve the primary function of penetrating through any oxide films 52, shown in the figures as a dark line on the outer surfaces of the respective pads 14 and 16 and frames 20 and 22, that typically coat the respective upper, mating surfaces of the pads and frames before they are soldered together. If the sharp peaks 50 are formed on the surface of a previously formed pad 14 or 16 or frame 20 or 22, then the material of the peaks should consist of the same eutectic alloy, or the single component thereof, that comprises the upper portion of the respective pad or frame on which they are formed. However, in the embodiments illustrated in FIGS. 4C and 4D and discussed below, in which the sharp peaks 50 are formed on the pads and frames first, and then covered with a coating 56 or 62 of the eutectic alloy or component thereof, thereby forming conforming sharp peaks 58 on the upper surface of the overlying eutectic coating, then the material of the first formed peaks 50 may comprise either the same or a different material than that comprising the upper portion of the respective pad or frame on which they are formed.

The corresponding pairs of pads 14 and 16 and frames 20 and 22 can be formed by conventional substrate masking and material deposition techniques, including electroplating and vacuum deposition techniques, to have almost any configuration, area and thickness desired, within the resolution limits of the masking and deposition processes selected, and with the proviso that the minimum thickness of the portion of the pads and frames comprising the eutectic alloy or component thereof be not less than about 1 μm thick, where 1 μm=1×10$^{-6}$ meter. Additionally, the pads 14 and 16 and frames 20 and 22 can be formed by either a "positive" process, in which the material is deposited on the target areas defined by openings thorough a suitable mask, or alternatively, in a "negative" process, in which the material is deposited as a single layer over the entire substrate, and the unwanted portions of the layer then removed, e.g., by photo-etching techniques.

The sharp upstanding peaks 50 of the pads 14 and 16 and frames 20 and 22 can be formed by similar masking and vacuum deposition techniques, but with the additional requirement that the sidewalls of the peaks taper to a relatively sharp point. In one of several possible modes, the sharp peaks 50 are deposited onto the target surface as macroscopic conical or pyramidal structures using conventional vacuum deposition techniques and a two-layer, metal mask (not illustrated). The upper layer of the mask is very thin and includes a small, circular "pin-hole" aperture through it. The lower metal layer has a greater thickness, viz., slightly greater than the desired height of the peak 50 to be formed, and has a larger circular aperture through it, viz., one having a diameter slightly larger than that of the base of the desired peak, and is concentric with the smaller aperture. When the mask is placed over the substrate, the small aperture directs the atoms of the depositing material onto the target area defined at the bottom of the large aperture in the form of a growing frusto-conical structure.

In one advantageous embodiment of the invention, the sharp peaks 50 have height of about 6–7 µm, and a base diameter of about 30 µm. In addition, the sharp peaks 50 should be distributed uniformly over the surface of the respective pads 14 and 16 and frames 20 and 22, and in such number that they occupy from between about 1 to 10% of the total area of the respective pad or frame on which they are formed.

Figure 4B:
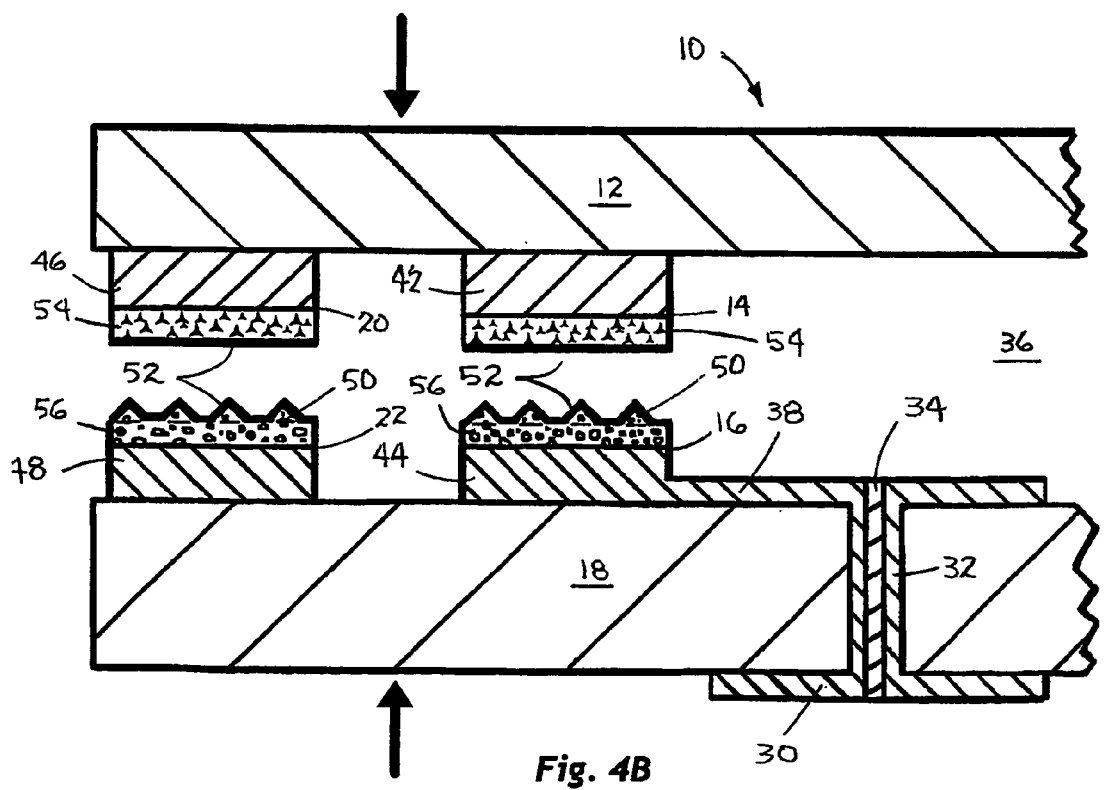
FIG. 4B is a cross-sectional detail view similar to that of FIG. 4A, showing another mode for carrying out the invention.

Another mode for carrying out the invention is illustrated in the enlarged cross sectional view of FIG. 4B. The arrangement in FIG. 4B is similar to that shown in FIG. 4A, except that the respective pads 14 and 16 and frames 20 and 22 comprise respective lower portions 42, 44, 46 and 48 that, while of a material that is electrically conductive, e.g., a metal or a semiconductor, does not necessarily include any of the eutectic alloy components comprising the upper portion of the pad or frame. For example, the respective lower portions 42, 44, 46 and 48 of the respective first and second pads 14 and 16 and frames 20 and 22 can comprise the same respective materials used in the metallizations of the die 14, typically aluminum, and the patterned metal layers 26 and 28 of the interconnective substrate 18, respectively, which may include copper, aluminum, tungsten, gold, nickel, silver, or layers thereof.

In the embodiment of FIG. 4B, the upper portions of the pads 14 and 16 and frames 20 and 22 that comprise the eutectic alloy component(s) are made by first forming coatings 54 and 56 of the respective alloy components on the respective upper surfaces of the respective lower portions 42, 44, 46 or 48 of the pads and frames, and then forming the sharp peaks 50 on the upper surfaces of the respective coatings. Since the sharp peaks 50 are formed on the upper surfaces of at least one of the respective eutectic coatings 54 or 56, the peaks are formed to consist of the same eutectic alloy component(s) comprising the upper portion of the respective pad or frame on which they are formed.

Figure 4C:
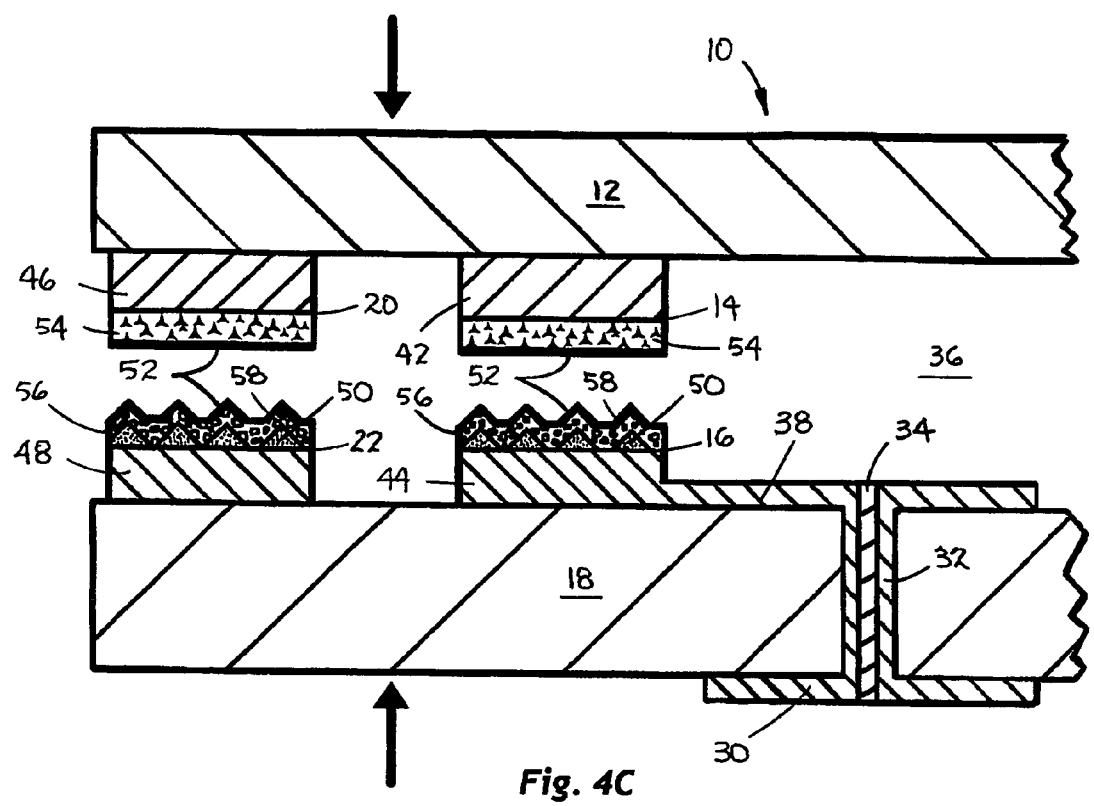
FIG. 4C is a cross-sectional detail view similar to that of FIG. 4A, showing yet another mode for carrying out the invention.

Another mode for carrying out the invention is illustrated in the enlarged cross sectional view of FIG. 4C. The arrangement in FIG. 4C is similar to that shown in FIG. 4B, except that the sharp peaks 50 are formed first on the respective upper surfaces of the lower portions 42 or 44 and 46 or 48 of the respective pads and frames, then the coatings 54 and 56 of the eutectic alloy components are formed over the upper portions of the respective pads and frames, including over the sharp peaks 50 previously formed thereon. The first formed sharp peaks 50 thereby form conforming sharp peaks 58 on the upper surface of the respective eutectic coating 54 and/or 56 overlying them, and accordingly, may, but need not necessarily, consist of the same eutectic alloy component(s) overlying them. Thus, in one possible mode, the sharp peaks 50 can comprise a material that is insoluble in the eutectic alloy at the soldering temperature thereof, whereby the sharp peaks 50 can act as spacers for controlling the distance between respective corresponding pairs of pads 14 and 16 and frames 20 and 22.

Figure 4D:
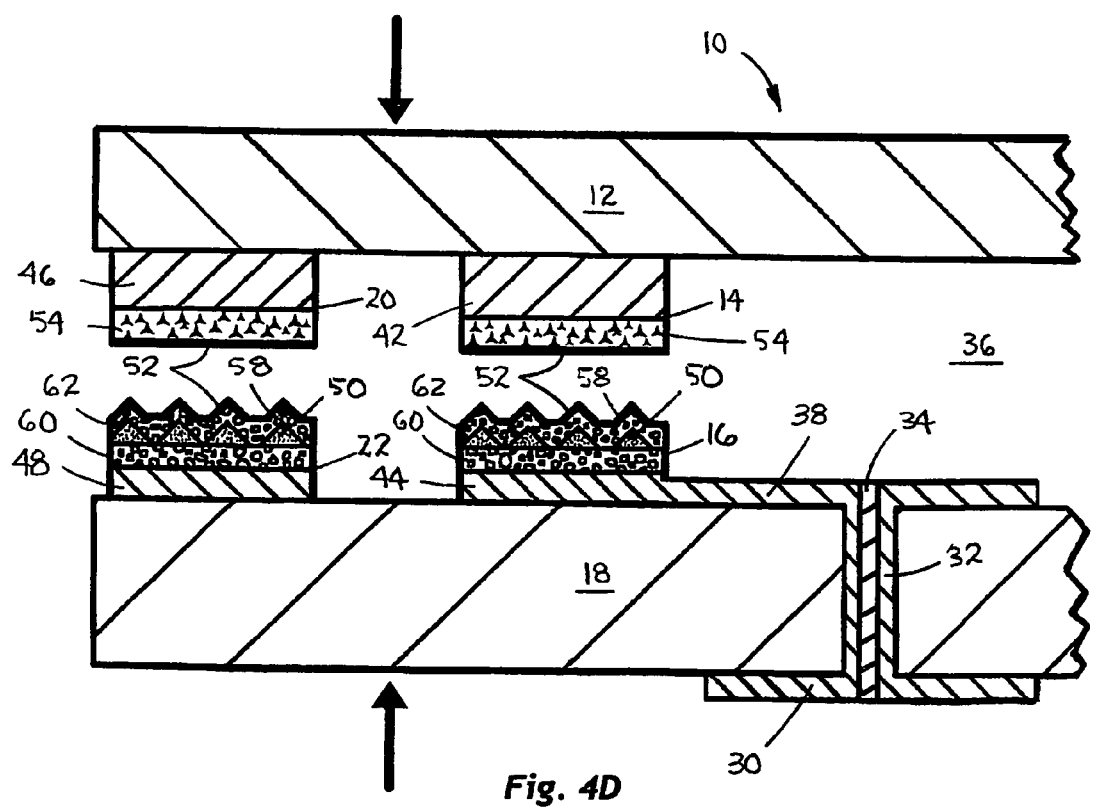
FIG. 4D is a cross-sectional detail view similar to that of FIG. 4A, showing still yet another mode for carrying out the invention.

Yet another possible mode for carrying out the invention is illustrated in the enlarged cross sectional view of FIG. 4D, which is similar to the arrangement in FIG. 4C, except that the sharp peaks 50 are sandwiched between a first coating 60 of the eutectic alloy component(s) comprising the upper portion of the respective pad or frame, and a second coating 62 of the same eutectic material, which is formed over the upper surfaces of the first coating 60 and the sharp peaks 50. As in the embodiment illustrated in FIG. 4C, the sharp peaks 50, may, but need not necessarily, consist of the same eutectic alloy component(s) as the first and second eutectic component coatings 60 and 62.

The method whereby the first substrate or die 12 of the package 10 is soldered to and in electrical connection with the second, interconnective substrate 18 thereof, and optionally, whereby the package is simultaneously hermetically sealed, is now described in connection with FIGS. 4A–4D.

Initially, the respective first surfaces of the first and second substrates 12 and 18 are urged toward each other, i.e., in the directions of the respective arrows shown in FIGS. 4A–4D, such that the upper surfaces of the respective pads 14 and 16 and frames 20 and 22 in each corresponding pair thereof are brought together in a forceful opposing abutment with each other. The amount of the force required in the opposing abutment of the pads and frames will vary, depending in the materials involved and the areas of the respective features in abutment. However, in one possible mode of carrying out the invention, if the area of the respective pads and frames occupied by the sharp peaks 50 is controlled to be between about 1 to 10% of the total area thereof, then the appropriate pressure applied between the two substrates is between about 0.03 to 0.05 Newtons/mm$^2$ ("N/mm$^2$"), or 4 to 7 pounds/in$^2$. ("psi").

After they are forcefully abutted as above, the opposing pairs of pads and frames are heated to at least the soldering temperature of the particular eutectic alloy comprising the upper portions thereof, which is typically 5–10° C. above the melting temperature of the alloy. Additionally, in those embodiments in which the upper portion of one set of the pads and frames consists of only one component of the eutectic alloy, and the pads and frames in the other set comprise the full complement of eutectic components, the abutting pads and frames should be heated to between about 5-10° C. above the eutectic soldering temperature.

In one advantageous mode of carrying out the invention, the heating is effected with a laser (not illustrated) operating in the microwave range of frequencies, and arranged to irradiate the second, or lower surface of the second substrate 18, which is relatively transparent to the radiation produced thereby, to achieve a very rapid rate of heating of the pads and frames. In such a heating arrangement, the lands 30 and the vias 32 can be offset laterally from the second pads 16 on the first surface of the interconnective substrate 18 so that they do not obscure the pads from the laser, and are thereby heated more effectively.

As the corresponding pairs of forcefully abutting pads 14 and 16 and frames 20 and 22 are heated, they begin to soften, relative to any hard, thin, and refractory oxide films 52 previously formed thereon, and this softening enables the sharp peaks 50 or 58 on the at least one pad and frame in each pair thereof to penetrate and break through the oxide films on the respective pads and frames and thereby directly contact the upper surface of the opposing other pad or frame in the pair without the use of a flux. This forceful, direct contact of the eutectic components at or slightly above the soldering temperature of the eutectic alloy initiates a rapid melting and dissolution of the upper portions of the respective opposing pairs of first and second pads 14 and 16 and frames 20 and 22 into each other, commencing at the respective tips of the sharp peaks 50 or 58.

After joining, the pads 14 and 16 and frames 20 and 22 are cooled to cause the inter-dissolved, molten eutectic upper portions thereof to solidify into an electrically conductive joint between each corresponding pair of first and second pads 14 and 16, and simultaneously, into a continuous, airtight joint between the frames 20 and 22 that closes and hermetically seals the narrow space 36 inside of the frames and between the respective first surfaces of the die 14 and the interconnective substrate 18, including the active surface of the die and the electrical connections between the die and the substrate.

As will be evident from the foregoing description, many modifications are possible in terms of the materials and processes of the present invention without departing from its scope. For example, it may be seen that the optional sealing frames 20 and 22 can be omitted, and the die 14 of the package 10 hermetically sealed using a conventional lid or plastic encapsulant, as described above in connection with the conventional package 100 shown in FIGS. 5–7.

Additionally, while the attachment of a single die 14 to the interconnective substrate 18 has been shown and described herein, it will be seen that the method is readily extensible to the attachment and hermetic sealing of a number of dies, each independently of the others, to a single interconnective substrate, to thereby form a so-called "Multi-Chip Module" ("MCM").

Even further, those of skill in the art will appreciate that the method of attaching the die 14 to and in electrical connection with the interconnective substrate 18 may be readily extended to attaching the semiconductor package 10 thereby formed to and in electrical connection with a main, or mother board with lead-free alloys, and again, without the use of fluxes or reducing atmospheres. In light of the above, it is therefore submitted that the scope of the present invention is not limited to the specific modes and embodiments described and illustrated herein, but rather, commensurate with that of the claims appended hereafter, and their equivalents.

What is claimed is:

1. A method for soldering a first substrate (12) to and in electrical connection with a second substrate (18) without using a flux or reducing atmosphere, the method characterized by:
   forming a first electrically conductive pad (14) on a first surface of the first substrate (12), the first pad including an upper portion comprising at least one component of an electrically conductive eutectic alloy;
   forming a corresponding second pad (16) on a first surface of the second substrate (18), the second pad including an upper portion comprising at least one other component of the eutectic alloy;
   forming at least one sharp upstanding peak (50, 58) on an upper surface of at least one of the first and second pads (14, 16);
   urging the respective first surfaces of the first and second substrates (12, 18) toward each other such that the respective upper surfaces of the first and second pads (14, 16) are brought together in a forceful opposing abutment with each other;
   heating the opposing pads (14, 16) to at least the soldering temperature of the eutectic alloy and until the at least one sharp upstanding peak (50, 58) on the at least one pad penetrates through any oxide films (52) on the respective upper surfaces of the pads and contacts the upper surface of the opposing other pad, thereby initiating melting and dissolution of the respective upper portions of the opposing pads, including the sharp upstanding peaks, into each other; and,
   cooling the opposing pads to solidify the dissolved, molten upper portions thereof into an electrically conductive joint between the pads; and,
   wherein forming the at least one sharp peak (50, 58) is characterized by:
   forming a lower portion (42, 44, 46, 48) of the at least one pad (14, 16, 20, 22), the lower portion comprising a metal or a semiconductor:
   forming a coating (56) on an upper surface of the lower portion of the at least one pad, the coating consisting of the same at least one eutectic alloy component comprising the upper portion of the at least one pad; and,
   forming the at least one peak (50, 58) on an upper surface of the coating (56), the at least one peak consisting of the same at least one eutectic alloy component comprising the upper portion of the at least one pad.

2. The method of claim 1, wherein:
   the first substrate (12) comprises a semiconductor die;
   the first pad (14) comprises one or more signal input/output pads of the die;
   the second substrate (18) comprises an interconnective substrate of a semiconductor package (10); and,
   the second pad (16) comprises one or more signal connection pads of the interconnective substrate (18),
   whereby the die (12) is electrically interconnected with the substrate (18).

3. The method of claim 2, wherein:
   the first pad (14) further comprises a frame (20) around a periphery of the first surface of the die (12); and,
   the second pad (16) further comprises a corresponding frame (22) around a periphery of the first surface of the interconnective substrate (18),
   whereby a space (36) inside of the frames (20, 22) and between the respective first surfaces of the die (12) and the substrate (18) is closed and hermetically sealed from the surrounding ambient simultaneously with the electrical interconnection of the die with the substrate.

4. The method of any one of claims 1–3, wherein the at least one eutectic alloy components are selected from the group consisting of: Gold (Au); aluminum (Al); germanium (Ge); zinc (Zn); silicon (Si); cadmium (Cd); tin (Sn); copper (Cu); bismuth (Bi); silver (Ag); and, lead (Pb).

5. The method of any one of claims 1–3, wherein at least one of the respective upper portions of the first and the second pads (14, 16, 20, 22) is formed by a vacuum deposition process or an electroplating process.

6. The method of any one of claims 1–3, wherein the at least one sharp upstanding peak (50, 58) is formed by a vacuum deposition process.

7. The method of any one of claims 1–3, wherein the heating is effected with a laser.

8. A method for soldering a first substrate (12) to and in electrical connection with a second substrate (18) without using a flux or reducing atmosphere, the method characterized by:
   forming a first electrically conductive pad (14) on a first surface of the first substrate (12), the first pad including an upper portion comprising at least one component of an electrically conductive eutectic alloy:
   forming a corresponding second pad (16) on a first surface of the second substrate (18), the second pad including an upper portion comprising at least one other component of the eutectic alloy;

forming at least one sharp upstanding peak (50, 58) on an upper surface of at least one of the first and second pads (14, 16);

urging the respective first surfaces of the first and second substrates (12, 18) toward each other such that the respective upper surfaces of the first and second pads (14, 16) are brought together in a forceful opposing abutment with each other;

heating the opposing pads (14, 16) to at least the soldering temperature of the eutectic alloy and until the at least one sharp upstanding peak (50, 58) on the at least one pad penetrates through any oxide films (52) on the respective upper surfaces of the pads and contacts the upper surface of the opposing other pad, thereby initiating melting and dissolution of the respective upper portions of the opposing pads, including the sharp upstanding peaks, into each other; and, cooling the opposing pads to solidify the dissolved, molten upper portions thereof into an electrically conductive joint between the pads; and, wherein forming the at least one sharp peak (50, 58) is characterized by:

forming a lower portion (42, 44, 46, 48) of the at least one pad (14, 16, 20, 22), the lower portion comprising a metal or a semiconductor;

forming the at least one peak (50, 58) on an upper surface of the lower portion of the at least one pad; and, forming a coating (56) over the at least one peak and the upper surface of the lower portion of the at least one pad, the coating (56) consisting of the same at least one eutectic alloy component comprising the upper portion of the at least one pad.

9. A method for soldering a first substrate (12) to and in electrical connection with a second substrate (18) without using a flux or reducing atmosphere, the method characterized by:

forming a first electrically conductive pad (14) on a first surface of the first substrate (12), the first pad including an upper portion comprising at least one component of an electrically conductive eutectic alloy;

forming a corresponding second pad (16) on a first surface of the second substrate (18), the second pad including an upper portion comprising at least one other component of the eutectic alloy;

forming at least one sharp upstanding peak (50, 58) on an upper surface of at least one of the first and second pads (14, 16);

urging the respective first surfaces of the first and second substrates (12, 18) toward each other such that the respective upper surfaces of the first and second pads (14, 16) are brought together in a forceful opposing abutment with each other;

heating the opposing pads (14, 16) to at least the soldering temperature of the eutectic alloy and until the at least one sharp upstanding peak (50, 58) on the at least one pad penetrates through any oxide films (52) on the respective upper surfaces of the pads and contacts the upper surface of the opposing other pad, thereby initiating melting and dissolution of the respective upper portions of the opposing pads, including the sharp upstanding peaks, into each other, and cooling the opposing pads to solidify the dissolved, molten upper portions thereof into an electrically conductive joint between the pads; and, wherein forming the at least one sharp peak (50, 58) is characterized by:

forming a lower portion (42, 44, 46, 48) of the at least one pad (12, 14, 20, 22), the lower portion comprising a metal or a semiconductor;

forming a first coating (60) on an upper surface of the lower portion of the at least one pad, the first coating consisting of the same at least one eutectic alloy component comprising the upper portion of the at least one pad;

forming the at least one peak (50, 58) on an upper surface of the first coating (60); and, forming a second coating (62) over the at least one peak (50, 58) and the upper surface of the first coating (60), the second coating consisting of the same at least one eutectic alloy component comprising the upper portion of the at least one pad.

10. The method of claim 2, further characterized by molding a monolithic body (122) of a dielectric plastic over the die (12) and at least a portion of the interconnective substrate (18), thereby hermetically sealing the die.

11. The method of claim 2, further characterized by placing a lid (124) over the die (12) and forming a continuous seal around a periphery of the die and between a peripheral portion of the lid and the interconnective substrate (18), thereby hermetically sealing the die.

12. The method of any one of claims 1–3, wherein the second substrate (18) has a second surface opposite to the first surface thereof, the second surface having a electrically conductive land (30) thereon, and further characterized by forming an electrically conductive, hermetically sealed via (32) through the second substrate connecting the second pad (16) to the land.

13. The method of claim 12, wherein the land (30) and the via (32) are laterally offset from the second pad (16).

14. A semiconductor package (10) made in accordance with any one of the methods of claims 2, 3, 10, or 11.

15. A semiconductor package (10) made in accordance with the method of claim 13.

\* \* \* \* \*